United States Patent
Baek et al.

(10) Patent No.: US 12,314,578 B2
(45) Date of Patent: May 27, 2025

(54) MEMORY, CONTROLLER, MEMORY SYSTEM AND OPERATION METHOD OF MEMORY SYSTEM

(71) Applicant: SK hynix Inc., Gyeonggi-do (KR)

(72) Inventors: Jin Ho Baek, Gyeonggi-do (KR); Young Pyo Joo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 41 days.

(21) Appl. No.: 18/304,345

(22) Filed: Apr. 21, 2023

(65) Prior Publication Data
US 2024/0094927 A1 Mar. 21, 2024

(30) Foreign Application Priority Data

Sep. 21, 2022 (KR) .......... 10-2022-0119236
Feb. 28, 2023 (KR) .......... 10-2023-0026607

(51) Int. Cl.
*G06F 3/06* (2006.01)

(52) U.S. Cl.
CPC .......... *G06F 3/0625* (2013.01); *G06F 3/0659* (2013.01); *G06F 3/0673* (2013.01); *G06F 2212/7202* (2013.01)

(58) Field of Classification Search
CPC .... G06F 3/0625; G06F 3/0659; G06F 3/0673; G06F 2212/7202
See application file for complete search history.

(56) References Cited

U.S. PATENT DOCUMENTS

| | | | |
|---|---|---|---|
| 9,558,805 B2 | 1/2017 | Kang et al. | |
| 2007/0050569 A1* | 3/2007 | Haustein | G06F 3/067 711/154 |
| 2009/0172499 A1* | 7/2009 | Olbrich | G06F 3/0604 714/773 |
| 2010/0169604 A1* | 7/2010 | Trika | G06F 12/0246 711/170 |
| 2011/0035605 A1* | 2/2011 | McKean | G06F 11/1076 713/300 |
| 2020/0241796 A1* | 7/2020 | Sugahara | G06F 12/10 |
| 2021/0149797 A1* | 5/2021 | Kanno | G06F 13/4068 |
| 2021/0173577 A1* | 6/2021 | Kale | G06F 3/048 |
| 2021/0319824 A1* | 10/2021 | Ro | G11C 11/406 |
| 2021/0335437 A1 | 10/2021 | Tsern et al. | |
| 2023/0082636 A1* | 3/2023 | Zhu | G06F 11/1451 714/16 |

* cited by examiner

*Primary Examiner* — Kalpit Parikh
(74) *Attorney, Agent, or Firm* — IP & T GROUP LLP

(57) ABSTRACT

A memory controller includes: a data separator configured to separate host write data into upper data and lower data; an address generator configured to generate a first address and a second address based on a host address; a command generator configured to generate one or more first commands for writing the upper data into a first storage region that is selected based on the first address in a memory, and one or more second commands for writing the lower data into a second storage region that is selected based on the second address in the memory; and a control block configured to control the address generator and the command generator to make a difference in power consumption between the first storage region and the second storage region.

18 Claims, 8 Drawing Sheets

FIG. 3

| HOST_ADD, Bank address | | | | | | | | | HOST_ADD, Row address | | | | | | | | | HOST_ADD, Column Address | | | | | | | | |
|---|---|---|---|---|---|---|---|---|---|---|---|---|---|---|---|---|---|---|---|---|---|---|---|---|---|
| 0 | 1 | 2 | 3 | 4 | 5 | 6 | 7 | | 0 | 1 | 2 | 3 | 4 | 5 | 6 | 7 | | HOST_ADD, Bank Address 0~3 | | | | | | | | HOST_ADD, Bank Address 4-7 | | | | | | | |
| | | | | | | | | | | | | | | | | | | 0 | 1 | 2 | 3 | 4 | 5 | 6 | 7 | 0 | 1 | 2 | 3 | 4 | 5 | 6 | 7 |
| MEM_ADD_0, Bank Address | | | | | | | | | MEM_ADD_0, Row Address | | | | | | | | | MEM_ADD_0, Column Address | | | | | | | | |
| 0 | 1 | 2 | 3 | 0 | 1 | 2 | 3 | | 0 | 1 | 2 | 3 | 4 | 5 | 6 | 7 | | 0 | 1 | 2 | 3 | 4 | 5 | 6 | 7 | 8 | 9 | 10 | 11 | 12 | 13 | 14 | 15 |
| MEM_ADD_1, Bank Address | | | | | | | | | MEM_ADD_1, Row Address | | | | | | | | | MEM_ADD_1, Column Address | | | | | | | | |
| 4 | 5 | 6 | 7 | 4 | 5 | 6 | 7 | | 0 | 1 | 2 | 3 | 4 | 5 | 6 | 7 | | 0 | 1 | 2 | 3 | 4 | 5 | 6 | 7 | 8 | 9 | 10 | 11 | 12 | 13 | 14 | 15 |

FIG. 4

| HOST_ADD, Bank address | | HOST_ADD, Address | Row | HOST_ADD, Column Address | |
|---|---|---|---|---|---|
| 0~K | K+1~2K+1 | | | HOST_ADD, Bank Address 0~K | K+1~2K+1 |
| MEM_ADD_0, Bank Address 0~K | MEM_ADD_1, Bank Address K+1~2K+1 | MEM_ADD_0, Address 0~L | MEM_ADD_0, Column Address 0~M | 0~M | M+1~2M+1 |
| | | MEM_ADD_1, Address 0~L | MEM_ADD_1, Column Address 0~M | 0~M | M+1~2M+1 |

MEMORY, CONTROLLER, MEMORY SYSTEM AND OPERATION METHOD OF MEMORY SYSTEM

CROSS-REFERENCE TO RELATED APPLICATIONS

The present application claims priority of Korean Patent Application No. 10-2022-0119236, filed on Sep. 21, 2022 and Korean Patent Application No. 10-2023-0026607, filed on Feb. 28, 2023, which are both incorporated herein by reference in their entirety.

BACKGROUND

1. Field

Various embodiments of the present invention relate to a memory system.

2. Description of the Related Art

In the field of machine learning, which is one of the fields of artificial intelligence, it is essential to collect and analyze big data. As the size of data used in the machine learning increases exponentially, the amount of the memory required by a Personal Computer (PC), a server, and a data center that process the data also increases exponentially.

As the amount of the used memory increases, the amount of power consumption and the amount of greenhouse gas emission, such as a data system using a large amount of memory, increase. This calls for the development of a technology capable of reducing the power consumption used by a memory.

SUMMARY

Embodiments of the present invention are directed to a technology for reducing power consumption of a memory.

In accordance with an embodiment of the present invention, a controller includes: a data separator configured to separate host write data into upper data and lower data; an address generator configured to generate a first address and a second address based on a host address; a command generator configured to generate one or more first commands for writing the upper data into a first storage region that is selected based on the first address in a memory, and one or more second commands for writing the lower data into a second storage region that is selected based on the second address in the memory; and a control block configured to control the address generator and the command generator to make a difference in power consumption between the first storage region and the second storage region.

In accordance with another embodiment of the present invention, a memory includes: a first storage region configured to store therein upper data; and a second storage region configured to store therein lower data, wherein a refresh rate for the first storage region and a refresh rate for the second storage region are different from each other.

In the memory, the upper data may include more integers than the lower data, and the lower data may include more decimal numbers than the upper data. The refresh rate for the first storage region may be higher than the refresh rate for the second storage region. The memory may further include a refresh control circuit configured to control a refresh operation on the first and second storage regions in response to a refresh command so that the respective first and second storage regions are refreshed at different refresh rates from each other. The memory may further include a refresh control circuit configured to control a refresh operation to be performed on both the first storage region and the second storage region in response to a first refresh command and controlling a refresh operation to be performed on the first storage region in response to a second refresh command. The first storage region may have a storage characteristic different from that of the second storage region. The first storage region may have a flip-flop storage characteristic. The second storage region may have a nonvolatile storage characteristic that perform a refresh operation to maintain stored data.

In accordance with another embodiment of the present invention, a memory system includes: a memory; and a memory controller, wherein the memory controller includes: a data separator configured to separate host write data into upper data and lower data; an address generator configured to generate a first address and a second address based on a host address; a command generator configured to generate one or more first commands for writing the upper data into a first storage region that is selected based on the first address in the memory, and generate one or more second commands for writing the lower data into a second storage region that is selected based on the second address in the memory; and a control block configured to control the address generator and the command generator to make a difference in power consumption between the first storage region and the second storage region.

In the memory system, the upper data may include more integers than the lower data, and the lower data may include more decimal numbers than the upper data. The host write data may include a plurality of numbers each of which is 2N bits, and the data separator may separate, from the host write data, upper N bits of each of the plurality of numbers as the upper data and lower N bits of each of the plurality of numbers as the lower data, where N is an integer greater than 0.

In accordance with another embodiment of the present invention, a method for operating a memory system includes: receiving, by a memory controller, a write request including host write data and a host write address from a host; separating, by the memory controller, the host write data into upper data and lower data; generating, by the memory controller, a first write address and a second write address based on the host write address; directing, by the memory controller, a memory to perform an operation of writing the upper data into a first storage region that is selected based on the first write address; storing, by the memory, the upper data into the first storage region; directing, by the memory controller, the memory to perform an operation of writing the lower data into a second storage region that is selected based on the second write address; and storing, by the memory, the lower data into the second storage region.

The method may further include refreshing, by the memory, the first storage region at a first refresh rate and the second storage region at a second refresh rate, the first refresh rate being greater than the second refresh rate. The upper data may include more integers than the lower data, and the lower data may include more decimal numbers than the upper data. The host write data may include a plurality of numbers each of which is 2N bits, and the separating may include separating, from the host write data, upper N bits of each of the plurality of numbers as the upper data and lower N bits of each of the plurality of numbers as the lower data, where N is an integer greater than 0. The method may further include receiving, by the memory controller, a read request including a host read address from the host; generating, by the memory controller, a first read address and a second read address based on the host read address; directing, by the memory controller, the memory to perform a read operation for the first storage region that is selected based on the first read address; reading, by the memory, the upper data from the first storage region; directing, by the memory controller, the memory to perform a read operation for the second storage region that is selected based on the second read address; reading, by the memory, the lower data from the second storage region; generating, by the memory controller, host read data by combining the read upper and lower data; and providing, by the memory controller, the host with the host read data.

In accordance with another embodiment of the present invention, a memory system includes: a memory including first and second storage regions and configured to refresh the first storage region at a first rate and the second storage region at a second rate; and a controller configured to: separate first and second parts from a data piece in response to a write request provided together with the data piece, and control the memory to store the first and second parts into the respective first and second storage regions.

The first rate may be greater than the second rate. The data piece may represent a rational number, the first part may represent an integer part of the rational number, and the second part may represent a decimal part of the rational number. The first part may be a predetermined number of upper bits within the data piece, and the second part may be remaining lower bits within the data piece. The controller may be further configured to: read the first and second parts from the respective first and second storage regions in response to a read request for the data piece, and combine the read first and second parts into the data piece to be provided as a response to the read request. The controller may be further configured to control the memory to refresh the first and second storage regions.

BRIEF DESCRIPTION OF THE DRAWINGS

FIG. 3 is a diagram for describing an operation of an address generator shown in FIG. 1 in accordance with an embodiment of the present invention.

FIG. 4 is a diagram for describing an operation of the address generator shown in FIG. 1 in accordance with an embodiment of the present invention.

DETAILED DESCRIPTION

Figure 1:
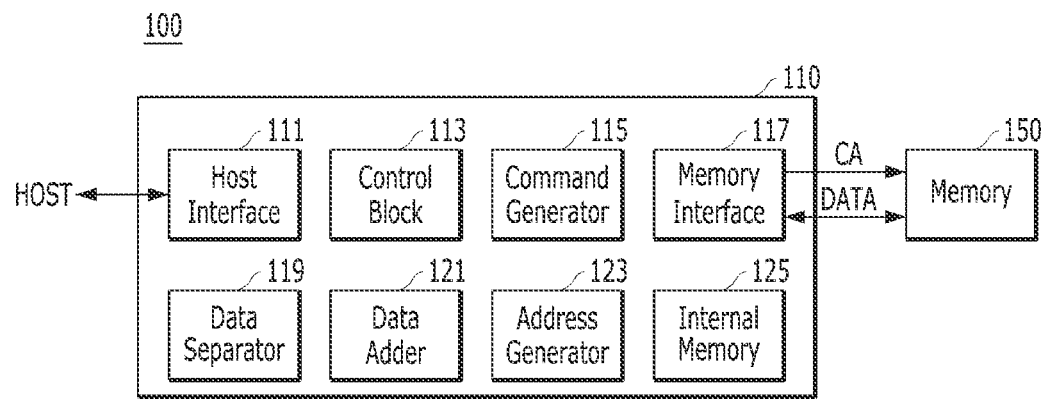
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

In terms of the characteristics of machine learning, numbers configured by integer and decimal parts (e.g., rational numbers: hereinafter, representatively referred to as rational numbers) are mainly handled rather than integers during calculations. Since a rational number including an integer part and a decimal part is stored in the same region of a memory, the error rate may be the same. However, in the field of machine learning and other fields, accuracy of the integer part is sometimes regarded as more important than the accuracy of the decimal part. Accordingly, the following embodiments of the present invention provide a technique for reducing power consumption of a memory by dividing a rational number into an integer part and a decimal part, storing the integer part and the decimal part in different regions of the memory, and keeping the accuracy of the stored integer part greater than the accuracy of the stored decimal part.

FIG. 1 is a block diagram illustrating a memory system 100 in accordance with an embodiment of the present invention.

Referring to FIG. 1, the memory system 100 may include a memory controller 110 and a memory 150.

The memory controller 110 may control the operation of the memory 150 according to a request of the host HOST. A host HOST may include a CPU (Central Processing Unit), a GPU (Graphic Processing Unit), an AP (Application Processor), or the like. The memory controller 110 may include a host interface 111, a control block 113, a command generator 115, a memory interface 117, a data separator 119, a data adder 121, and an address generator 123. The memory controller 110 may be embedded in a CPU, a GPU, an AP, or the like. In this case, the host HOST may mean the configuration other than the memory controller 110 in the CPU, GPU, AP, or the like. For example, when the memory controller 110 is embedded in a CPU, the host HOST in FIG. 1 may represent the constituent elements other than the memory controller 110 in the CPU.

The host interface 111 may be an interface for communication between the host HOST and the memory controller 110. A write request, a read request, etc. may be transferred to the memory controller 110 from the host HOST through the host interface 111. Also, the processing results of the operations directed by the host HOST may be transferred from the memory controller 110 to the host HOST through the host interface 111.

The control block 113 may control the overall operations of the memory controller 110 and schedule the operations to be directed to the memory 150. The control block 113 may change the order of the requests received from the host HOST and the order of the operations to be directed to the memory 150 in order to improve the performance of the memory 150. For example, even though the host HOST requests the memory 150 to perform a read operation first and then to perform a write operation, the order may be adjusted in such a manner that the write operation is performed before the read operation. The control block 113 may control operations of the host interface 111, the command generator 115, the memory interface 117, the data separator 119, the data adder 121, and the address generator 123.

The command generator 115 may generate a command to be applied to the memory 150 according to the order of the operations determined by the control block 113. For example, the command may include an active command, a precharge command, a refresh command, a refresh setting command, a read command, a write command, a mode register command, and the like.

The memory interface 117 may be provided for an interface between the memory controller 110 and the memory 150. A command/address signal CA may be transferred from the memory controller 110 to the memory 150 through the memory interface 117 and data DATA may be transferred and received through the memory interface 117. The memory interface 117 may also be referred to as a physical (PHY) interface.

The data separator 119 may separate the host write data transferred from the host HOST into upper data and lower data. The upper data may include more integer parts than the lower data, and the lower data may include more decimal parts than the upper data. The upper data may be data for which accuracy is very important, and the lower data may be data for which accuracy is relatively less important than the upper data. The upper data and the lower data may be written into different regions in the memory 150. The data separator 119 will be described in detail later with reference to FIG. 2.

The data adder 121 may generate read data that are requested by the host HOST by adding the upper data and the lower data that are read from the memory 150. The data separator 119 may separate the host write data transferred from the host HOST during a write operation into upper data and lower data, while the data adder 121 generate the host read data by adding the upper data and the lower data transferred from the memory 150 during a read operation. The data adder 121 will be described in detail later with reference to FIG. 2.

The address generator 123 may generate a first address and a second address based on a host address which is transferred from the host HOST. The first address may be an address for selecting a first storage region where the upper data are stored in the memory 150, and the second address may be an address for selecting a second storage region where the lower data are stored in the memory 150. The address generator 123 may generate a first address and a second address based on the host address which is included in a write request of the host HOST during a write operation, and the address generator 123 may generate a first address and a second address based on the host address which is included in a read request of the host HOST during a read operation. The address generator 123 will be described in detail later with reference to FIGS. 3 to 4.

Meanwhile, the control block 113 according to an embodiment of the present invention may control the above components (especially the command generator 115 and the address generator 123) to make a difference in power consumption between the first storage region and the second storage region. For example, the control block 113 may control the command generator 115 and the address generator 123 so that there is a difference in the access number between the first storage region and the second storage region. For example, the command generator 115 and the address generator 123 may be controlled such that refresh rates of the first storage region and the second storage region are different from each other.

For example, under the control of the control block 113, the command generator 115 may issue a refresh command to refresh memory cells in the first storage region and a refresh command to refresh memory cells in the second storage region at different rates to provide the memory 150. In this case, the command generator 115 may more frequently generate a refresh command for refreshing memory cells in the first storage region. For example, under the control of the control block 113, the command generator 115 may generate and provide a refresh setting command to set different refresh rates for the first and second storage regions to the memory 150.

The memory 150 may perform an operation directed by the memory controller 110. The memory 150 may include storage regions having different storage characteristics. For example, memory 150 may include both a volatile storage region with a volatile storage characteristic and a nonvolatile storage region with a nonvolatile storage characteristic. The volatile storage characteristic may have characteristics of losing stored data when power is cut off, and the nonvolatile storage characteristic may have characteristics of maintaining stored data even when power is cut off. Recently, even in the case of a memory with the nonvolatile storage characteristic, a refresh operation has been performed to recover the characteristics of memory cells due to the occurrence of a drift phenomenon in which thresholds of memory cells move. The memory 150 will be described in detail with reference to FIGS. 5A to 5C.

Meanwhile, the memory controller 110 may further include an internal memory 125. The internal memory 125 may serve as an operating memory of the memory system 100 and the memory controller 110, and store data for driving the memory system 100 and the memory controller 110. Depending on the configuration, the internal memory 125 may be implemented as a volatile memory such as a static random access memory (SRAM) or dynamic random access memory (DRAM), or as a nonvolatile memory such as a flash memory, a resistive RAM (ReRAM), a phase-change RAM (PCRAM), a ferroelectric RAM (FeRAM) or a magnetic RAM (MRAM), or other types of RAM. Depending on an embodiment, the internal memory 125 may be implemented using a register, a flip-flop, a static random access memory (SRAM), or a combination thereof. Furthermore, the internal memory 125 stores data necessary to perform operations such as data write and read between the host and the memory 150, and may include a program memory, a data memory, a write buffer, a read buffer, a map buffer, etc.

In particular, according to an embodiment of the present invention, the internal memory 125 may include a first storage region. In this case, under the control of the control block 113, the address generator 123 may generate a first address for accessing the internal memory 125, and a second address for accessing the memory 150 located outside the memory controller 110. According to an embodiment, the internal memory 125 may include both a volatile storage region with a volatile storage characteristic and a nonvolatile storage region with a nonvolatile storage characteristic. As described above, since the first storage region is disposed in the internal memory 125, the amount of power consumed to transmit data to the external memory 150 may be reduced.

According to an embodiment of the present invention, the first storage region and the second storage region may be allocated to storage regions of the memory 150 having different storage characteristics. In this case, under the control of the control block 113, the address generator 123 may generate a first address and a second address for respectively accessing the storage regions of the memory 150 having different storage characteristics. For example, the address generator 123 may designate the second storage region as a volatile storage region or a nonvolatile storage region by generating a second address that accesses a storage region of the memory 150 with a storage characteristic that must perform a refresh operation to maintain the stored data. For example, the address generator 123 may designate the second storage region as a nonvolatile storage region by generating the second address to access the nonvolatile storage region. According to another embodiment, the first storage region and the second storage region may be allocated to storage regions of the internal memory 125 having different storage characteristics, respectively. In this case, under the control of the control block 113, the address generator 123 may designate the first storage region as a flip-flop memory by generating a first address to access the storage region of the internal memory 125 with a flip-flop type storage characteristic.

In the following embodiment, a case where both the first storage region and the second storage region are disposed in the memory 150 that interfaces with the memory controller 110 through the memory interface 117 will be described as an example.

Figure 2:
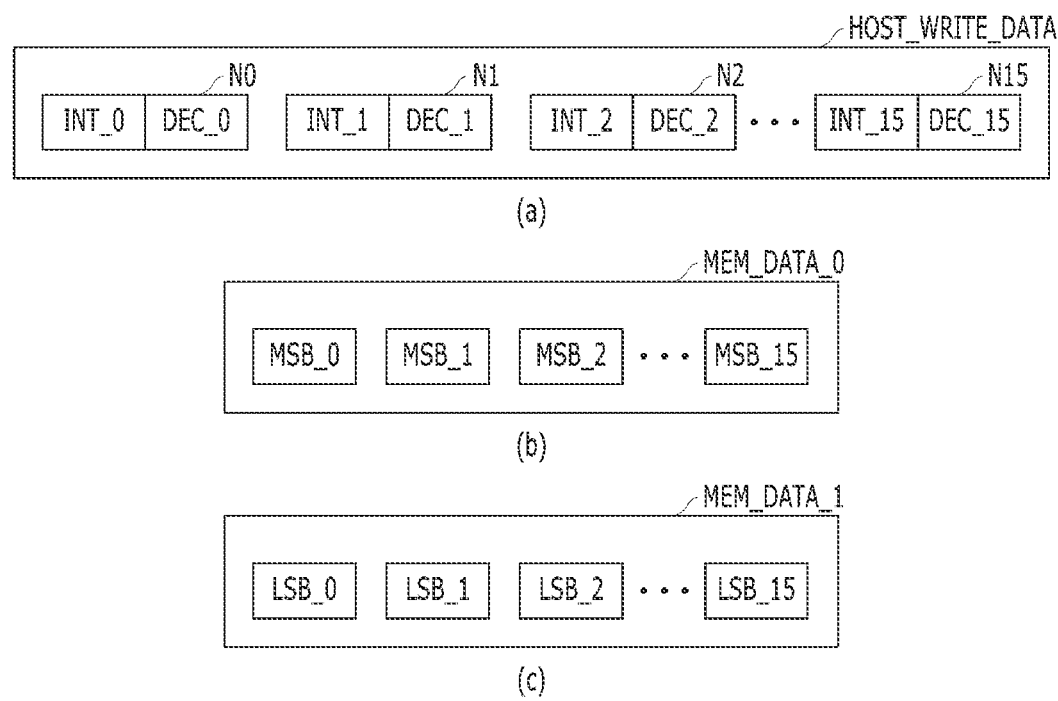
FIG. 2 is a diagram for describing operations of a data separator and a data adder shown in FIG. 1 in accordance with an embodiment of the present invention.

FIG. 2 is a diagram for describing the operations of the data separator 119 and the data adder 121 shown in FIG. 1 in accordance with an embodiment of the present invention.

Referring to FIG. 2, (a) shows host write data HOST_WRITE_DATA transferred from the host HOST. The host write data HOST_WRITE_DATA may have a size of 512 bits and may include 16 rational numbers N0 to N15 each of which is 32 bits. Each of the rational numbers N0 to N15 may include an integer part INT_0 to INT_15 and a decimal part DEC_0 to DEC_15. In each of the 32-bit rational numbers N0 to N15, it is common that the size of the integer part INT_0 to INT_15 and the size of the decimal part DEC_0 to DEC_15 are not fixed (the floating decimal point). In the case of the rational numbers that are used in the field of machine learning, it is common that the size of the decimal part (i.e., a number of bits to represent the decimal part) is greater than the size of the integer part (i.e., a number of bits to represent the integer part). For example, the integer part INT_0 of the rational number N0 may be 10 bits, and the decimal part DEC_0 of the rational number N0 may be 22 bits, and the integer part INT_7 of the rational number N7 may be 14 bits, and the decimal part DEC_7 of the rational number N7 may be 18 bits.

Referring to FIG. 2, (b) shows upper data MEM_DATA_0 that are separated from the host write data HOST_WRITE_DATA by the data separator 119, and (c) shows lower data MEM_DATA_1 that are separated from the host write data by the data separator 119.

In (b) of FIG. 2, the upper data MEM_DATA_0 may be obtained by classifying the upper 16 bits MSB_0 to MSB_15 of each of the rational numbers. In other words, MSB_0 may be the upper 16 bits of the 32-bit rational number N0, and MSB_15 may be the upper 16 bits of the 32-bit rational number N15.

In (c) of FIG. 2, the lower data MEM_DATA_1 may be obtained by classifying the lower 16 bits LSB_0 to LSB_15 of each of the rational numbers. That is, LSB_1 may be the lower 16 bits of the 32-bit rational number N1, and LSB_3 may be the lower 16 bits of the 32-bit rational number N3.

The data separator 119 may separate, as the upper data MEM_DATA_0, the upper 16 bits MSB_0 to MSB_15 of the 32-bit rational numbers N0 to N15 that are included in the host write data HOST_WRITE_DATA and may separate, as the lower data MEM_DATA_1, the lower 16 bits LSB_0 to LSB_15 of the rational numbers N0 to N15.

Since it is common that the size of the decimal part is greater than the size of the integer part for each of the rational numbers N0 to N15, most of the decimal parts DEC_0 to DEC_15 of the rational numbers N0 to N15 may be included in the lower data MEM_DATA_1, and a part of the decimal parts DEC_0 to DEC_15 and the integer parts INT_0 to INT_15 of the rational numbers N0 to N15 may be included in the upper data MEM_DATA_0. For example, when the integer part INT_0 of the rational number N0 is 10 bits and the decimal part DEC_0 of the rational number N0 is 22 bits, MSB_0 of the upper data MEM_DATA_0 may include a 10-bit integer and a 6-bit decimal number, and LSB_0 of the lower data MEM_DATA_1 may include a 16-bit decimal number.

That is, the lower data MEM_DATA_1 obtained by the data separator 119 may include some of the decimal parts DEC_0 to DEC_15 of the rational numbers N0 to N15 included in the host write data HOST_WRITE_DATA, and the upper data MEM_DATA_0 may include the integer parts INT_0 to INT_15 and the rest of the decimal parts DEC_0 to DEC_15 of the rational numbers N0 to N15 that are included in the host write data HOST_WRITE_DATA. Since the upper data MEM_DATA_0 include the integer parts INT_0 to INT_15 of the rational numbers N0 to N15 and the lower data MEM_DATA_1 include only the decimal parts DEC_0 to DEC_15 of the rational numbers N0 to N15, higher accuracy may be required for the upper data MEM_DATA_0 than the lower data MEM_DATA_1.

The data adder 121 may perform an operation which is opposite to that of the data separator 119. The data separator 119 may perform an operation of dividing the host write data HOST_WRITE_DATA into upper data MEM_DATA_0 and lower data MEM_DATA_1 during a write operation, but the data adder 121 may perform an operation of generating host read data whose format is the same as that of the host write data HOST_WRITE_DATA by adding the upper data MEM_DATA_0 and the lower data MEM_DATA_1 that are read during a read operation.

FIG. 3 is a diagram for describing an operation of the address generator 123 shown in FIG. 1 in accordance with an embodiment of the present invention.

Referring to FIG. 3, a table showing how the address generator 123 generates the first address MEM_ADD_0 and the second address MEM_ADD_1 according to the value of the host address HOST_ADD, is shown.

The host address HOST_ADD may be an address included in a write request and a read request transferred from the host HOST to the memory controller 110. The host address HOST_ADD may include a bank address, a row address, and a column address. Here, for the sake of convenience in description, the value of the bank address of the host address HOST_ADD may range from 0 to 7, and the value of the row address may range from 0 to 7, and the value of the column address may range from 0 to 7.

The first address MEM_ADD_0 may be an address generated by the address generator 123 based on the host address HOST_ADD, and the first address MEM_ADD_0 may be an address for selecting a first storage region to store the upper data MEM_DATA_0 in the memory 150. Like the host address HOST_ADD, the first address MEM_ADD_0 may include a bank address, a row address, and a column address. Here, the value of the bank address of the first address MEM_ADD_0 may range from 0 to 3, and the value of the row address may range from 0 to 7, and the value of the column address may range from 0 to 15.

The second address MEM_ADD_1 may be an address generated by the address generator 123 based on the host address HOST_ADD, and the second address MEM_ADD_1 may be an address for selecting a second storage region to store the lower data MEM_DATA_1 in the memory 150. Like the host address HOST_ADD, the second address MEM_ADD_1 may include a bank address, a row address, and a column address. Here, the value of the bank address of the second address MEM_ADD_1 may range from 4 to 7, the value of the row address may range from 0 to 7, and the value of the column address may range from 0 to 15.

Referring to FIG. 3, it may be seen that when the value of the bank address of the host address HOST_ADD is one of 0 to 3, the bank address of the first address MEM_ADD_0 is generated to have a value of one of 0 to 3. Also, it may be seen that the bank address of the second address MEM_ADD_1 is generated to have a value obtained by adding 4 to the bank address of host address HOST_ADD.

Also, it may be seen that when the value of the bank address of the host address HOST_ADD is one of 4 to 7, the bank address of the first address MEM_ADD_0 is generated to have a value obtained by subtracting 4 from the bank address of the host address HOST_ADD. Also, it may be seen that the bank address of the second address MEM_ADD_1 is generated to be the same as the bank address of the host address HOST_ADD.

Referring to FIG. 3, it may be seen that the row address of the host address HOST_ADD and the row address of the first address MEM_ADD_0 are generated to have the same value and that the row address of the second address MEM_ADD_1 is also generated to have the same value as the row addresses of the host address HOST_ADD and the first address MEM_ADD_0. It may be seen that the values of the row addresses of the host address HOST_ADD, the first address MEM_ADD_0, and the second address MEM_ADD_1 are all the same.

Referring to FIG. 3, it may be seen that when the bank address of the host address HOST_ADD is in the range of 0 to 3 and the value of the column address of the host address HOST_ADD is one of 0 to 7, the column address of the first address MEM_ADD_0 and the column address of the second address MEM_ADD_1 are generated to have the same value as the column address of the host address HOST_ADD. Also, it may be seen that when the bank address of the host address HOST_ADD is in the range of 4 to 7 and the value of the column address of the host address HOST_ADD is one of 0 to 7, the column address of the first address MEM_ADD_0 and the column address of the second address MEM_ADD_1 are generated as a value obtained by adding 8 to the column address of the host address HOST_ADD.

When a conversion operation is performed according to the table shown in FIG. 3 and when the host address HOST_ADD is (2, 6, 3) in the order of (bank address, row address, column address), the first address MEM_ADD_0 may be generated as (2, 6, 3) and the second address MEM_ADD_1 may be generated as (6, 6, 3). Also, when the host address HOST_ADD is (6, 5, 6), the first address MEM_ADD_0 may be generated as (2, 5, 14) and the second address MEM_ADD_1 may be generated as (6, 5, 14).

Since the upper data MEM_DATA_0 and the lower data MEM_DATA_1 have to be stored in regions having different refresh rates in the memory 150, that is, different regions where refresh operations can be performed independently, the first address MEM_ADD_0 and the second address MEM_ADD_1 may be generated in such a manner that the lower data MEM_DATA_1 and the upper data MEM_DATA_0 may be stored in different banks. Since the value of the bank address of the first address MEM_ADD_0 is in the range of 0 to 3, the upper data MEM_DATA_0 may be stored in banks 0 to 3 in the memory 150, and since the value of the bank address of the second address MEM_ADD_1 is in the range of 4 to 7, the second data MEM_DATA_1 may be stored in banks 4 to 7 in the memory 150.

FIG. 4 is a diagram for describing an operation of the address generator 123 shown in FIG. 1 in accordance with an embodiment of the present invention. In FIG. 3, a case where address values are in a specific range is illustrated, but in FIG. 4, the range of the address values is not limited.

In FIG. 4, a case where the value of the bank address of the host address HOST_ADD ranges from 0 to 2K+1, and the value of the row address ranges from 0 to L, and the value of the column address ranges from 0 to M is illustrated. Each of K, L and M may be an arbitrary integer of 2 or greater.

Referring to FIG. 4, when the value of the bank address of the host address HOST_ADD is one of 0 to K, the value of the bank address of the first address MEM_ADD_0 may also be generated to have a value of one of 0 to K as well. Also, the value of the bank address of the second address MEM_ADD_1 may be generated to have a value obtained by adding K+1 to the bank address of the host address HOST_ADD.

When the value of the bank address of the host address HOST_ADD is one of K+1 to 2K+1, the value of the bank address of the first address MEM_ADD_0 may be generated to have a value obtained by subtracting K−1 from the bank address of the host address HOST_ADD. Also, the value of the bank address of the second address MEM_ADD_1 may be generated to have the same value as that of the bank address of the host address HOST_ADD.

Referring to FIG. 4, it may be seen that all values of the row addresses of the host address HOST_ADD, the first address MEM_ADD_0, and the second address MEM_ADD_1 are the same.

Referring to FIG. 4, it may be seen that when the bank address of the host address HOST_ADD is in the range of 0 to K and the value of the column address of the host address HOST_ADD is one of 0 to M, the column address of the first address MEM_ADD_0 and the column address of the second address MEM_ADD_1 are generated to have the same value as that of the column address of the host address HOST_ADD. Also, it may be seen that when the bank address of the host address HOST_ADD is in the range of K+1 to 2K+1 and the column address of the host address HOST_ADD is one of 0 to M, the column address of the first address MEM_ADD_0 and the column address of the second address MEM_ADD_1 are generated to have a value obtained by adding M+1 to the column address of the host address HOST_ADD.

Figure 5A:
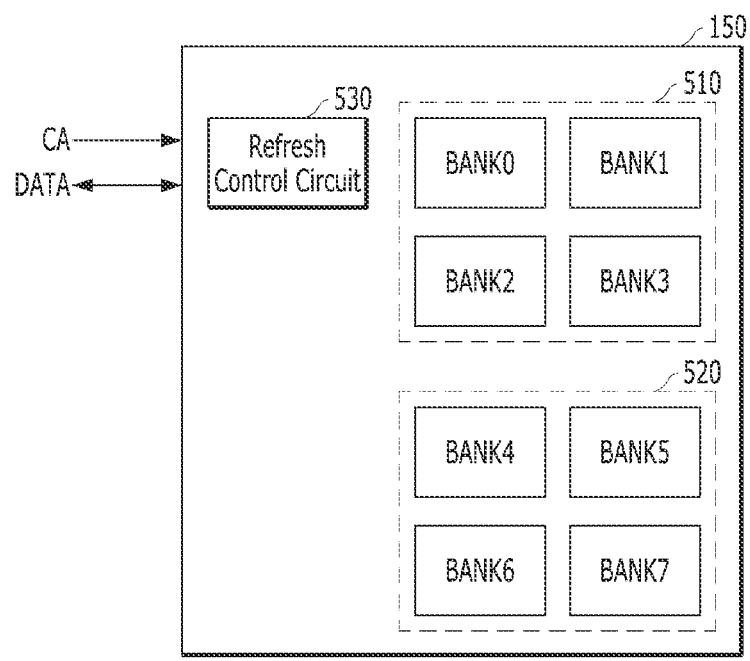
FIGS. 5A to 5C are detailed block diagrams illustrating a memory shown in FIG. 1 in accordance with an embodiment of the present invention.
Figure 5B:
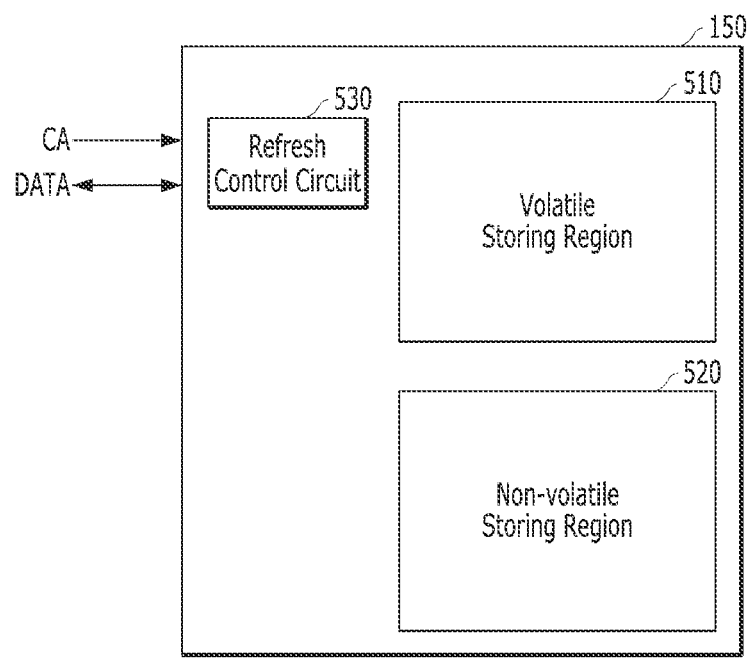
Figure 5C:
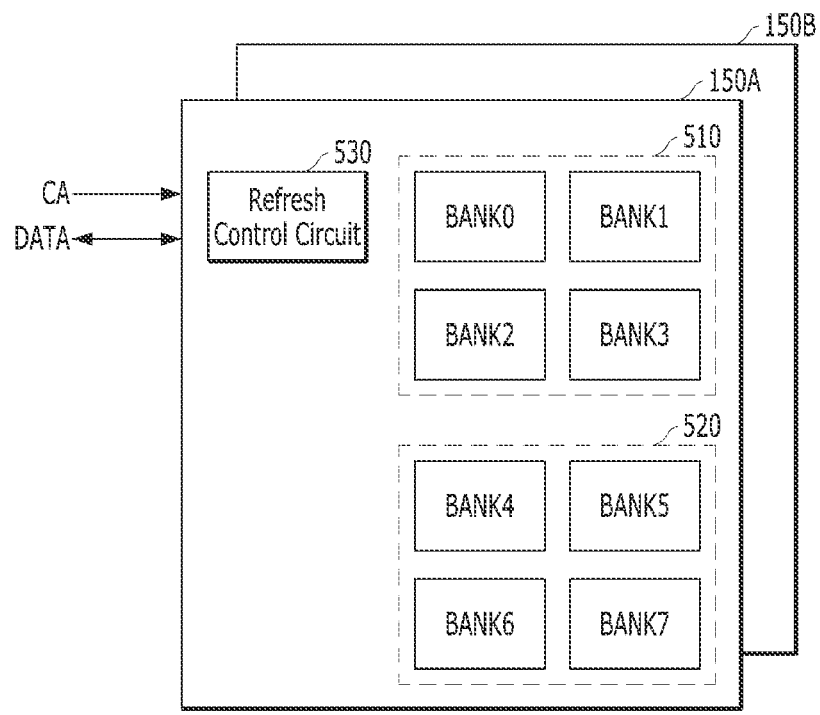

FIGS. 5A to 5C are detailed block diagrams illustrating the memory 150 shown in FIG. 1 in accordance with an embodiment of the present invention.

Referring to FIG. 5A, the memory 150 may perform an operation directed by the command/address signal CA transferred from the memory controller 110 and exchange data DATA with the memory controller 110. The memory 150 may include a first storage region 510, a second storage region 520, and a refresh control circuit 530.

The first storage region 510 may be a region that is accessed based on the first address MEM_ADD_0 (see FIGS. 3 and 4) which is generated by the address generator 123 and stores the upper data MEM_DATA_0 (see FIG. 2) which are obtained by the data separator 119. The first storage region 510 may include banks 0 to 3 BANK0 to BANK3. Each of the banks BANK0 to BANK3 may include a plurality of memory cells for storing data.

The second storage region 520 may be a region that is accessed based on the second address MEM_ADD_1 (see FIGS. 3 and 4) which is generated by the address generator 123 and stores the lower data MEM_DATA_1 (see FIG. 2) which are obtained by the data separator 119. The second storage region 520 may include banks 4 to 7 BANK4 to BANK7. Each of the banks BANK4 to BANK7 may include a plurality of memory cells for storing data.

The refresh control circuit 530 may control refresh rates for the first storage region 510 and the second storage region 520 to be different from each other. To be specific, the refresh control circuit 530 may control the refresh rate for the first storage region 510 to be relatively high and control the refresh rate for the second storage region 520 to be relatively low. The refresh control circuit 530 may control the first storage region 510 to be refreshed more frequently than the second storage region 520. Since the first storage region 510 is refreshed more frequently than the second storage region 520, the accuracy of the upper data MEM_DATA_0 (see FIG. 2) stored in the first storage region 510 may be maintained high. Since the second storage region 520 is refreshed less frequently than the first storage region 510, the accuracy of the lower data MEM_DATA_1 (see FIG. 2) stored in the second storage region 520 may be maintained lower than that of the upper data MEM_DATA_0. Namely, errors may rarely occur in the upper data MEM_DATA_0, and more errors may occur in the lower data MEM_DATA_1 than in the upper data MEM_DATA_0. Since the refresh rate for the second storage region 520 is controlled lower than that of the first storage region 510, power consumption for refreshing the second storage region 520 may be reduced.

Controlling the refresh rates for the first storage region 510 and the second storage region 520 differently by the refresh control circuit 530 may be driven by the memory controller 110 or by the memory 150. This will be described below.

Refresh Rate Controlled by the Memory Controller 110

There are two types of refresh commands that may be applied from the memory controller 110 to the memory 150, and the refresh rates for the first storage region 510 and the second storage region 520 may be controlled to be different based on the two types of refresh commands. A first refresh command transferred from the memory controller 110 may be a command for refreshing both of the first storage region 510 and the second storage region 520. The refresh control circuit 530 may control both of the first storage region 510 and the second storage region 520 to be refreshed when the first refresh command is applied from the memory controller 110. The second refresh command transferred from the memory controller 110 may be a command for refreshing the first storage region 510. The refresh control circuit 530 may control a refresh operation to be performed only in the first storage region 510 when the second refresh command is applied from the memory controller 110. The memory controller 110 may control the refresh rates for the first storage region 510 and the second storage region 520 by adjusting the number of times that each of the first refresh command and the second refresh commands is applied to the memory 150. For example, when the memory controller 110 applies the first refresh command and the second refresh command to the memory 150 at a ratio of 1:1, the first storage region 510 may be refreshed twice as frequently as the second storage region 520. Also, when the memory controller 110 applies the first refresh command and the second refresh command to the memory 150 at a ratio of 2:1, the first storage region 510 may be refreshed 1.5 times more frequent than the second storage region 520.

Refresh Rate Controlled by the Memory 150

There is only one type of a refresh command that is applied from the memory controller 110 to the memory 150. The refresh control circuit 530 may control a refresh operation to be performed in the first storage region 510 whenever a refresh command is applied from the memory controller 110, but the refresh control circuit 530 may be able to control the refresh operation not to be performed at a predetermined rate in the second storage region 520. For example, the refresh control circuit 530 may perform a refresh operation in the first storage region 510 regardless of whether the refresh commands are applied an odd or even number of times or an even number of times, but the refresh control circuit 530 may be able to control a refresh operation to be performed in the second storage region 520 only when the refresh commands is applied an even number of times. The rate at which the refresh control circuit 530 controls the refresh operation not to be performed in the second storage region may be set based on a setting command which is transferred from the memory controller 110.

Meanwhile, in an embodiment of the present invention, the first storage region 510 and the second storage region 520 may have different storage characteristics. Referring to FIG. 5B, the first storage region 510 may be a volatile storage region with a volatile storage characteristic, and the second storage region 520 may be designated as a nonvolatile storage region with a nonvolatile storage characteristic. As mentioned above, in recent years, even in the case of a memory with a nonvolatile storage characteristic, a refresh operation has been carried out to recover the nonvolatile storage characteristic. Therefore, the second storage region 520 may be a nonvolatile storage region having a storage characteristic that require a refresh operation to maintain the stored data.

Depending on an embodiment, the first storage region 510 may be designated as a storage region having a flip-flop type storage characteristic.

In another embodiment of the present invention, the memory 150 may be divided into two or more memories 150A and 150B having different storage characteristics. Referring to FIG. 5C, the memory 150 may include a first memory 150A and a second memory 150B, which include a first storage region 510 and a second storage region 520, respectively. The first storage region 510 and the second storage region 520 of the first memory 150A may be designated as volatile storage regions with volatile storage characteristics, and the first storage region 510 and the second storage region 520 of the second memory 150B may be designated as nonvolatile storage regions with nonvolatile storage characteristics. In this case, the first storage region 510 and the second storage region 520 of the first memory 150A may be accessed by the first address MEM_ADD_0 and the second address MEM_ADD_1, respectively, and may be designated as regions for storing the upper data MEM_DATA_0 and the lower data MEM_DATA_1. Depending on an embodiment, one of the first storage region 510 and the second storage region 520 of the first memory 150A may be accessed by the first address MEM_ADD_0 to store the upper data MEM_DATA_0, and one of the first storage region 510 and the second storage region 520 of the second memory 150B may be accessed by the second address MEM_ADD_1 to store the lower data MEM_DATA_1.

Figure 6:
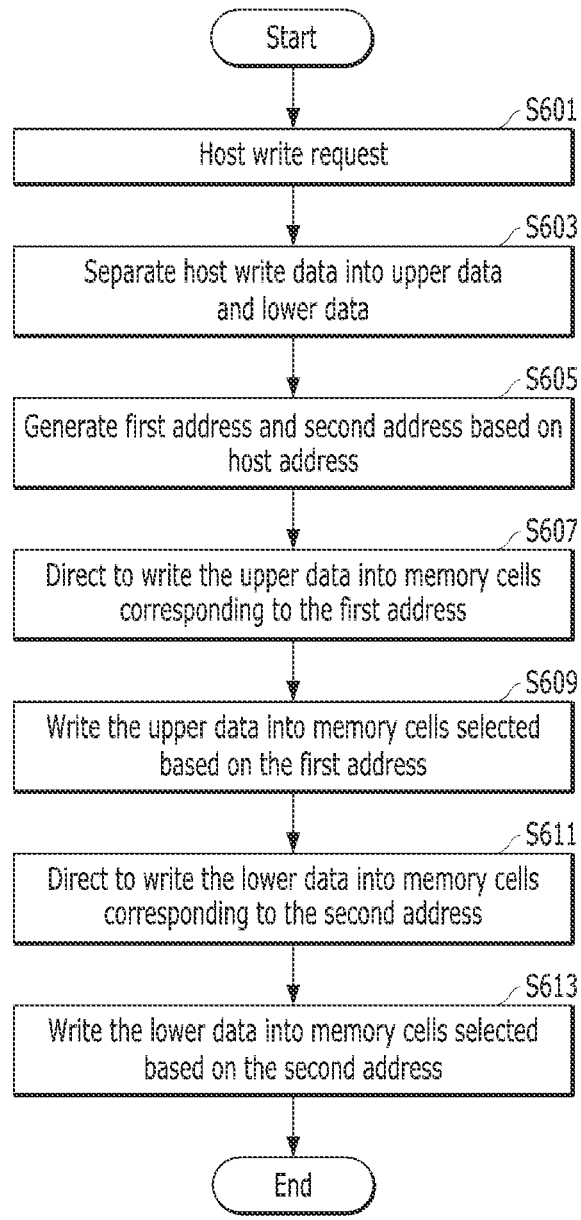
FIG. 6 is a flowchart for describing a write operation of the memory system shown in FIG. 1 in accordance with an embodiment of the present invention.

FIG. 6 is a flowchart for describing a write operation of the memory system 100 shown in FIG. 1 in accordance with an embodiment of the present invention.

Referring to FIG. 6, a write operation of the memory system 100 may begin, as the host HOST transfers a write request to the memory controller 110 at operation S601. The write request may include host write data HOST_WRITE_DATA and a host address HOST_ADD.

The data separator 119 of the memory controller 110 may separate the host write data HOST_WRITE_DATA into upper data MEM_DATA_0 and lower data MEM_DATA_1, which is described in FIG. 2, at operation S603.

The address generator 123 of the memory controller 110 may generate a first address MEM_ADD_0 and a second address MEM_ADD_1 based on the host address HOST_ADD, which is described in FIGS. 3 and 4, at operation S605.

The memory controller 110 may direct the memory 150 to write the upper data MEM_DATA_0 into the memory cells of the first storage region 510 that is selected based on the first address MEM_ADD_0 at operation S607. To be specific, an active command and a bank address and a row address of the first address MEM_ADD_0 may be transferred from the memory controller 110 to the memory 150 (direction of an active operation). Also, a write command, a bank address and a column address of the first address MEM_ADD_0, and the upper data MEM_DATA_0 may be transferred from the memory controller 110 to the memory 150 (direction of a write operation).

In response to the direction of the operation S607, the upper data MEM_DATA_0 may be written into the memory cells of the first storage region 510 that is selected based on the first address MEM_ADD_0 in the memory 150 at operation S609. This process may be divided into an active operation and a write operation. First, an active operation of activating a row which is selected based on a row address in a bank which is selected based on the bank address of the first address MEM_ADD_0 among the banks BANK0 to BANK3 of the first storage region 510 of the memory 150 may be performed. Then, a write operation of writing the upper data MEM_DATA_0 into the memory cells that are selected based on the column address of the first address MEM_ADD_0 among the memory cells of the activated row may be performed.

The memory controller 110 may direct the memory 150 to write the lower data MEM_DATA_1 into the memory cells of the second storage region 520 that is selected based on the second address MEM_ADD_0 at operation S611. To be specific, an active command, and a bank address and a row address of the second address MEM_ADD_1 may be transferred from the memory controller 110 to the memory 150 (direction of an active operation). Also, a write command, a bank address and a column address of the second address MEM_ADD_1, and the lower data MEM_DATA_1 may be transferred from the memory controller 110 to the memory 150 (direction of a write operation).

In response to the direction of the operation S611, the lower data MEM_DATA_1 may be written into the memory cells of the second storage region 520 that is selected based on the second address MEM_ADD_1 in the memory 150 at operation S613. This process may be divided into an active operation and a write operation. First, an active operation of activating a row selected based on the row address in the bank which is selected based on the bank address of the second address MEM_ADD_1 among the banks BANK4 to BANK7 of the second storage region 520 of the memory 150 may be performed. Then, a write operation of writing the lower data MEM_DATA_1 into the memory cells that are selected based on the column address of the second address MEM_ADD_1 among the memory cells of the activated row may be performed.

Through the above-described operation, among the host write data HOST_WRITE_DATA, the upper data MEM_DATA_0 including a large number of integer parts may be stored in the first storage region 510 of the memory 150, while the lower data MEM_DATA_1 including a large number of decimal parts may be stored in the second storage region 520 of the memory 150. Since the first storage region 510 in the memory 150 is refreshed more frequently than the second storage region 520, errors may hardly occur in the upper data MEM_DATA_0. Also, since the second storage region 520 of the memory 150 is refreshed less frequently than the first storage region 510, more errors may occur in the lower data MEM_DATA_1 than in the upper data MEM_DATA_0. However, errors occurring in the lower data MEM_DATA_1 may not cause a big problem in terms of the characteristics of data, and since the second storage region 520 is refreshed less frequently, power consumption of the memory 150 may be reduced.

Meanwhile, as described above, even in the case of a memory with a nonvolatile storage characteristic, a refresh operation may be performed to recover memory cells due to a drift phenomenon. Therefore, even in the case of a memory with a nonvolatile storage characteristic, the power consumption may be reduced by refreshing the first storage region 510 more often than the second storage region 520 and refreshing the second storage region 520 less frequently than the first storage region 510.

Figure 7:
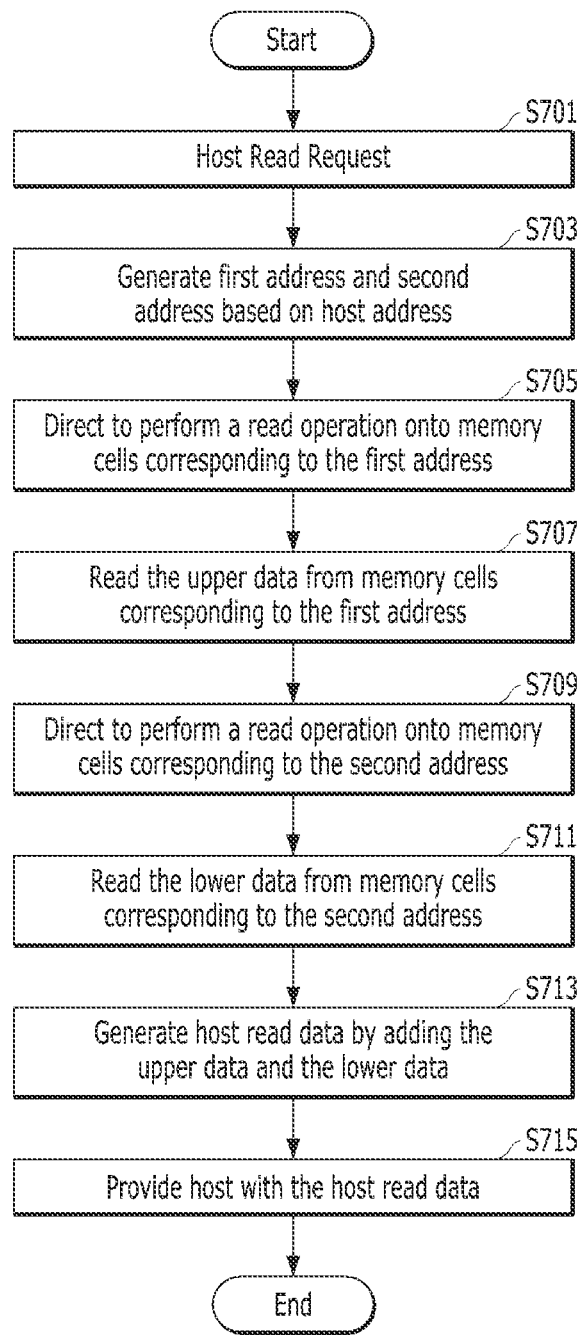
FIG. 7 is a flowchart for describing a read operation of the memory system shown in FIG. 1 in accordance with an embodiment of the present invention.

FIG. 7 is a flowchart for describing a read operation of the memory system 100 shown in FIG. 1 in accordance with an embodiment of the present invention.

Referring to FIG. 7, a read operation of the memory system 100 may begin as the host HOST transfers a read request to the memory controller 110 at operation S701. The read request may include a host address HOST_ADD.

The address generator 123 of the memory controller 110 may generate a first address MEM_ADD_0 and a second address MEM_ADD_1 based on the host address HOST_ADD, which is described in FIGS. 3 and 4, at operation S703.

The memory controller 110 may direct the memory 150 to perform a read operation onto the memory cells of the first storage region 510 that is selected based on the first address MEM_ADD_0 at operation S705. To be specific, an active command, and a bank address and a row address of the first address MEM_ADD_0 may be transferred from the memory controller 110 to the memory 150 (direction of an active operation). Then, a read command, and the bank address and a column address of the first address MEM_ADD_0 may be transferred from the memory controller 110 to the memory 150 (direction of a read operation).

In response to the direction of the operation S705, the upper data MEM_DATA_0 may be read from the memory cells of the first storage region 510 that is selected based on the first address MEM_ADD_0 in the memory 150 at operation S707. This process may be divided into an active operation and a read operation. First, an active operation of activating a row which is selected based on the row address in the bank which is selected based on the bank address of the first address MEM_ADD_0 among the banks BANK0 to BANK3 of the first storage region 510 of the memory 150 may be performed. Then, a read operation of reading the upper data MEM_DATA_0 from the memory cells that are selected based on the column address of the first address MEM_ADD_0 among the memory cells of the activated row may be performed. The upper data MEM_DATA_0 may be transferred from the memory 150 to the memory controller 110.

The memory controller 110 may direct the memory 150 to perform a read operation onto the memory cells of the second storage region 520 that is selected based on the second address MEM_ADD_1 at operation S709. To be specific, an active command, and a bank address and a row address of the second address MEM_ADD_1 may be transferred from the memory controller 110 to the memory 150 (direction of an active operation). Then, a read command, and the bank address and a column address of the second address MEM_ADD_1 may be transferred from the memory controller 110 to the memory 150 (direction of a read operation).

In response to the direction of the operation S709, the lower data MEM_DATA_1 may be read from the memory cells of the second storage region 520 that is selected based on the second address MEM_ADD_1 in the memory 150 at operation S711. This process may be divided into an active operation and a read operation. First, an active operation of activating a row which is selected based on a row address in a bank which is selected based on the bank address of the second address MEM_ADD_1 among the banks BANK4 to BANK7 of the second storage region 520 of the memory 150 may be performed. Then, a read operation of reading the lower data MEM_DATA_1 from the memory cells that are selected based on the column address of the second address MEM_ADD_1 among the memory cells of the activated row may be performed. The lower data MEM_DATA_1 may be transferred from the memory 150 to the memory controller 110.

The data adder 121 of the memory controller 110 may generate host read data by adding the upper data MEM_DATA_0 and the lower data MEM_DATA_1 that are transferred from the memory 150 at operation S713. In other words, the data adder 121 may be able to generate the host read data of the format shown in (a) of FIG. 2 by adding the upper data MEM_DATA_0 and the lower data MEM_DATA_1 whose formats are shown in (b) and (c) of FIG. 2.

The host read data generated by the data adder 121 may be provided to the host HOST at operation S715. The read operation of the memory system 100 may be terminated.

According to the embodiment of the present invention, power consumption of a memory may be reduced.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A controller comprising:
a data separator disposed within the controller and configured to separate host write data into upper data and lower data, wherein the host write data include a plurality of rational numbers each of which includes an integer part and a decimal part, and the data separator separates the host write data into the lower data including some of the decimal part, and the upper data including the integer part and the rest of the decimal part;
an address generator disposed within the controller and configured to generate a first address and a second address based on a host address;
a command generator disposed within the controller and configured to generate one or more first commands for writing the upper data into a first storage region that is selected based on the first address in a memory, and one or more second commands for writing the lower data into a second storage region that is selected based on the second address in the memory; and
a control block configured to control the address generator and the command generator to make a difference in power consumption between the first storage region and the second storage region,
wherein, in maintaining by the control block a higher accuracy for the upper data, the first storage region containing the upper data has a higher power consumption than the second storage containing the lower data.

2. The controller of claim 1, wherein the control block is configured to control the address generator and the command generator to make a difference in an access number between the first storage region and the second storage region.

3. The controller of claim 1, wherein the control block is configured to control the address generator and the command generator to control refresh rates for the first storage region and the second storage region to be different from each other.

4. The controller of claim 3, wherein the command generator is configured to issue a refresh command to refresh memory cells in the first storage region and a refresh command to refresh memory cells in the second storage region at different rates.

5. The controller of claim 4, wherein the command generator is configured to issue the refresh command for the first storage region, more frequently than the refresh command for the second storage region.

6. The controller of claim 3, wherein the command generator is configured to issue a refresh setting command for setting different refresh rates for the respective first and second storage regions.

7. The controller of claim 1, further comprising:
an internal memory configured to include the first storage region.

8. The controller of claim 7, wherein the control block is configured to control the address generator to generate the first address for accessing the internal memory and to generate the second address for accessing the memory located outside the controller.

9. The controller of claim 1, wherein the control block is configured to control the address generator to generate the first address and the second address for accessing the first storage region and the second storage region of the memory located outside the controller.

10. The controller of claim 1, wherein the control block is configured to control the address generator to generate the first address and the second address that respectively access the first and second storage regions with different storage characteristics.

11. The controller of claim 10, wherein the address generator is configured to generate the second address to access the second storage region with a storage characteristic that perform a refresh operation to maintain stored data.

12. The controller of claim 10, wherein the address generator is configured to generate the second address to access the second storage region with a nonvolatile storage characteristic.

13. The controller of claim 10, wherein the address generator is configured to generate the second address to access the second storage region with a flip-flop storage characteristic.

14. The controller of claim 1, further comprising a data adder configured to generate, during a read operation, host read data by adding the upper data read from the first storage region and the lower data read from the second storage region.

15. A memory system comprising:
- a memory; and
- a memory controller,
- wherein the memory controller includes:
  - a data separator disposed within the controller and configured to separate host write data into upper data and lower data, wherein the host write data include a plurality of rational numbers each of which includes an integer part and a decimal part, and the data separator separates the host write data into the lower data including some of the decimal part, and the upper data including the integer part and the rest of the decimal part;
  - an address generator disposed within the controller and configured to generate a first address and a second address based on a host address;
  - a command generator disposed within the controller and configured to generate one or more first commands for writing the upper data into a first storage region that is selected based on the first address in the memory, and generate one or more second commands for writing the lower data into a second storage region that is selected based on the second address in the memory; and
  - a control block configured to control the address generator and the command generator to make a difference in power consumption between the first storage region and the second storage region, wherein, in maintaining by the control block a higher accuracy for the upper data, the first storage region containing the upper data has a higher power consumption than the second storage containing the lower data.

16. The memory system of claim 15, wherein the control block is configured to control the address generator and the command generator to control refresh rates for the first storage region and the second storage region to be different from each other.

17. The memory system of claim 16, wherein the command generator is configured to issue a refresh command to refresh memory cells in the first storage region and a refresh command to refresh memory cells in the second storage region at different rates.

18. The memory system of claim 16, wherein the command generator is configured to issue a refresh setting command for setting different refresh rates for the respective first and second storage regions.

* * * * *